United States Patent
Chang et al.

(10) Patent No.: US 10,163,973 B2
(45) Date of Patent: Dec. 25, 2018

(54) METHOD FOR FORMING THE FRONT-SIDE ILLUMINATED IMAGE SENSOR DEVICE STRUCTURE WITH LIGHT PIPE

(71) Applicant: Taiwan Semiconductor Manufacturing Co., Ltd., Hsinchu (TW)

(72) Inventors: Feng-Kuei Chang, Changahua (TW); Keng-Yu Chou, Kaohsiung (TW); Jen-Cheng Liu, Hsinchu (TW); Jeng-Shyan Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 15 days.

(21) Appl. No.: 15/461,719

(22) Filed: Mar. 17, 2017

(65) Prior Publication Data

US 2018/0269251 A1    Sep. 20, 2018

(51) Int. Cl.
*H01L 27/146* (2006.01)
*G02B 6/43* (2006.01)
*G02B 6/42* (2006.01)

(52) U.S. Cl.
CPC ...... *H01L 27/14685* (2013.01); *G02B 6/4295* (2013.01); *G02B 6/43* (2013.01); *H01L 27/14621* (2013.01); *H01L 27/14627* (2013.01); *H01L 27/14636* (2013.01)

(58) Field of Classification Search
CPC ..... G02B 6/4295; G02B 6/43; H01L 27/3272; H01L 27/14685; H01L 27/14621; H01L 27/14627; H01L 27/14625; H01L 27/14629; H01L 27/14636; H01L 27/14689
See application file for complete search history.

(56) References Cited

U.S. PATENT DOCUMENTS

| | | | |
|---|---|---|---|
| 2007/0200054 A1* | 8/2007 | Reznik | H01L 27/14625 250/208.1 |
| 2009/0127442 A1* | 5/2009 | Lee | H01L 27/14625 250/227.11 |
| 2015/0349018 A1* | 12/2015 | Takami | H01L 27/14685 438/69 |

* cited by examiner

*Primary Examiner* — Thanhha Pham
(74) *Attorney, Agent, or Firm* — Birch, Stewart, Kolasch & Birch, LLP

(57) ABSTRACT

A method for forming an FSI image sensor device structure is provided. The method includes forming a pixel region in a substrate and forming a dielectric layer over the substrate. The method includes forming a trench through the dielectric layer, and the trench includes a top portion and a bottom portion, and the trench is directly above the pixel region. The method includes forming a protection layer in the bottom portion of the trench and enlarging a top width of the top portion of the trench, and the trench has a wide top portion and a narrow bottom portion. The wide top portion has top sidewall surfaces, the narrow bottom portion has bottom sidewall surfaces, and the top sidewall surfaces taper gradually toward the bottom sidewall surfaces. The method includes filling a transparent dielectric layer in the trench to form a light pipe.

20 Claims, 15 Drawing Sheets

METHOD FOR FORMING THE FRONT-SIDE ILLUMINATED IMAGE SENSOR DEVICE STRUCTURE WITH LIGHT PIPE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have been generally adequate for their intended purpose they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
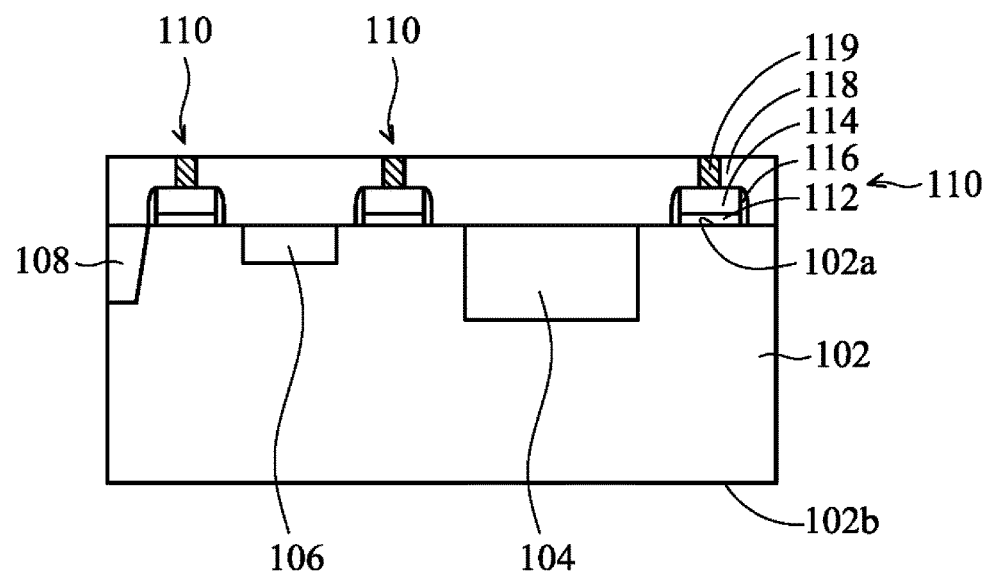
FIGS. 1A-1I show cross-sectional representations of various stages of forming a front-side illuminated (FSI) image sensor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a front-side illuminated (FSI) image sensor device structure and method for forming the same are provided. FIGS. 1A-1I show cross-sectional representations of various stages of forming an FSI image sensor device structure 100, in accordance with some embodiments of the disclosure. An FSI image sensor device structure with a light pipe is provided. The light pipe is configured to guide light from the top into the underlying pixel regions.

Referring to FIG. 1A, a substrate 102 is provided. The substrate 102 has a top surface 102a and a bottom surface 102b opposite to the top surface 102a. The substrate 102 may be made of silicon or another semiconductor material. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A pixel region 104 is formed in the substrate 102. The pixel regions 104 may include photosensitive elements. The photosensitive elements may include a photodiode, a partially pinned photodiode, a pinned photodiode, a photogate, or a photocapacitor. The pixel region 104 may be doped with n-type and/or p-type dopants. The pixel region 104 may be formed by an ion implantation process, a diffusion process, or another applicable process.

A doped region 106 is formed in the substrate 102 and between two transistor structures 110. The doped region 106 may be doped with n-type and/or p-type dopants.

An isolation structure 108, such as shallow trench isolation (STI) structures or local oxidation of silicon (LOCOS) structures, is formed in the substrate 102. The isolation structure 108 may define and isolate various integrated circuit devices.

The transistor structure 110 includes a gate dielectric layer 112 and a gate electrode layer 114 formed on the gate dielectric layer 112. The gate dielectric layer 112 is made of silicon oxide, silicon nitride, or a high dielectric constant material (high-k material). In some embodiments, the gate dielectric layer 112 is formed by a chemical vapor deposition (CVD) process.

The gate electrode layer 114 may be made of polysilicon or conductive material. The conductive material may include metal (e.g., tantalum, titanium, molybdenum, tungsten, platinum, aluminum, hafnium, ruthenium), a metal silicide (e.g., titanium silicide, cobalt silicide, nickel silicide, tantalum silicide), or a metal nitride (e.g., titanium nitride, tantalum nitride). In some embodiments, the gate electrode layer 114 is formed by a chemical vapor deposition (CVD) process or a physical vapor deposition (PVD) process.

The gate spacers 116 are formed on sidewalls of the transistor structure 110. In some embodiments, the gate spacers 116 are made of silicon oxide, silicon nitride, silicon oxynitride or another applicable material. In some embodiments, the gate spacers 116 are formed by a chemical vapor deposition (CVD) process or a physical vapor deposition (PVD) process.

An inter-layer dielectric (ILD) layer 118 is formed on the top surface 102a of the substrate 102 and over the transistor structure 110, and a contact structure 119 is formed on the transistor structure 110. The ILD layer 118 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or another applicable dielectric material. The ILD layer 118 may be formed by chemical vapor deposition (CVD), physical vapor deposition, (PVD), atomic layer deposition (ALD), spin-on coating, or another applicable process.

Figure 1B:
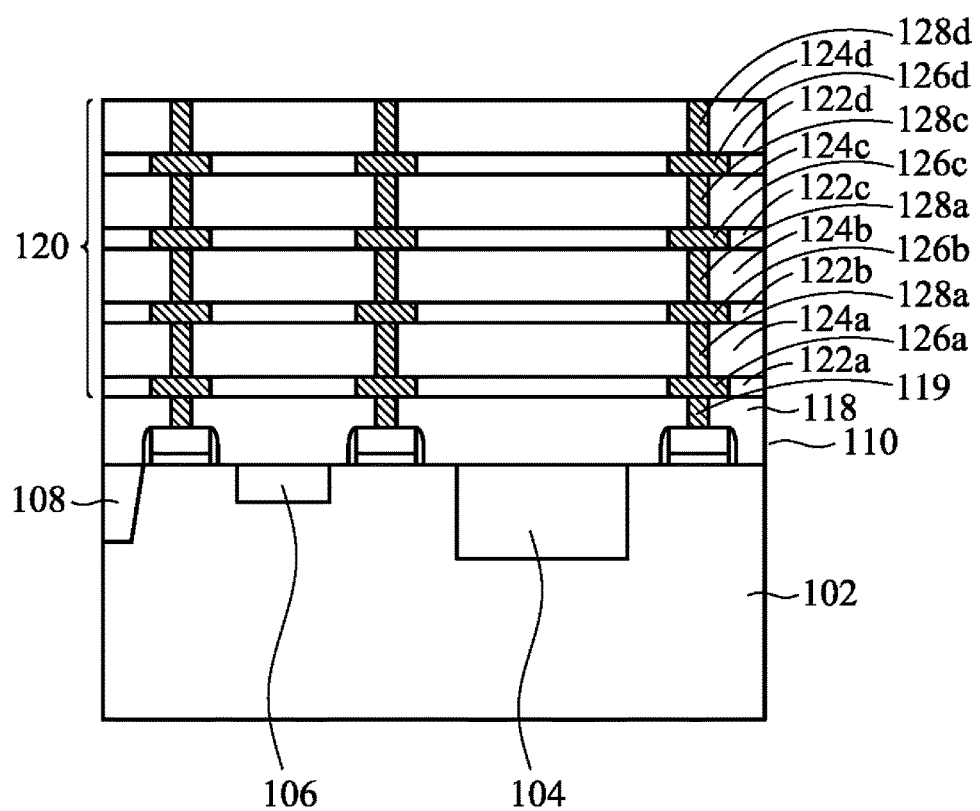

Afterwards, as shown in FIG. 1B, an interconnect structure 120 is formed over the substrate 102 and the ILD layer 118, in accordance with some embodiments of the disclosure. The interconnect structure 120 is used to electrically connect the signal of the transistor structure 110 to the external environment.

A number of the etching stop layers 122a, 122b, 122c and 122d are formed over the ILD layer 118. The etching stop layers 122a, 122b, 122c and 122d may include silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the etching stop layers 122a, 122b, 122c and 122d are formed by a chemical vapor deposition (CVD) process, a spin-on process, a sputtering process, or a combination thereof.

The interconnect structure 120 includes multiple conductive features formed in a number of the etching stop layers 122a, 122b, 122c and 122d and in a number of the dielectric layers 124a, 124b, 124c, 124d (such as inter-metal dielectric, IMD). One of the etching stop layers 122b, 122c and 122d is between two adjacent dielectric layers 124a, 124b, 124c and 124d. The number of etching stop layers 122a, 122b, 122c and 122d and the number of dielectric layers 124a, 124b, 124c and 124d may be changed according to actual application.

The dielectric layers 124a, 124b, 124c and 124d include multiple dielectric layers. The dielectric layers 124a, 124b, 124c and 124d may include silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layers 124a, 124b, 124c and 124d are formed by a chemical vapor deposition (CVD) process, a spin-on process, a sputtering process, or a combination thereof.

In some embodiments, the dielectric layers 124a, 124b, 124c and 124d are made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

The conductive features include a number of conductive lines 126a, 126b, 126c and 126d and a number of conductive vias 128a, 128b, 128c and 128d. Each of the conductive lines 126a, 126b, 126c and 126d is electrically connected to one of the conductive vias 128a, 128b, 128c and 128d. The conductive lines 126a, 126b, 126c and 126d are electrically connected to the transistor device 110 through the contact structure 119. In some embodiments, the first conductive line 126a is called a first metal layer ($M_1$), the second conductive line 126b is called a second metal layer ($M_2$), the third conductive line 126c is called a third metal layer ($M_3$), and the fourth conductive line 126d is called a fourth metal layer ($M_4$).

In some embodiments, the conductive features are made of metal materials, such as copper (Cu), aluminum (Al), titanium (Ti), tantalum (Ta), nickel (Ni), silver (Ag), gold (Au), indium (In), tin (Sn), or a combination thereof. In some embodiments, the conductive features are formed by electro-plating, electroless plating, sputtering, chemical vapor deposition (CVD) or another applicable process.

The conductive lines 126a, 126b, 126c and 126d and the conductive vias 128a, 128b, 128c and 128d as illustrated are exemplary, and the actual positioning and configuration of the conductive lines 126a, 126b, 126c and 126d and the conductive vias 128a, 128b, 128c and 128d may vary according to actual application.

Figure 1C:
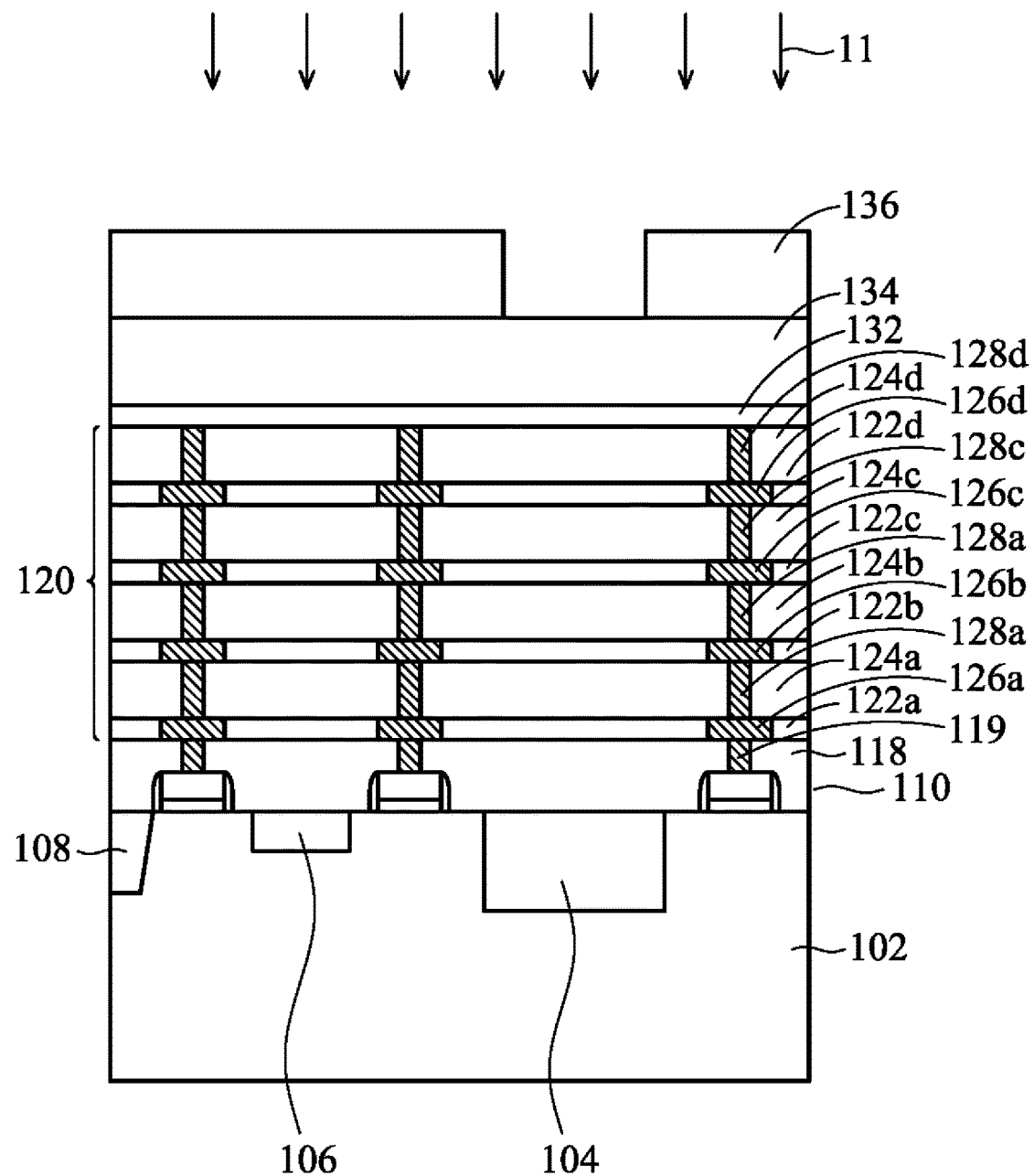

Afterwards, as shown in FIG. 1C, a fifth etching stop layer 132 is formed over the interconnect structure 120, in accordance with some embodiments of the disclosure. The fifth etching stop layer 132 may include silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the material of the fifth etching stop layer 132 is the same as that of the first etching stop layer 122a.

Next, a passivation layer 134 is formed over the fifth etching stop layer 132. The passivation layer 134 is configured to protect the underlying layers from being damaged or polluted by the outer environment, such as air or water vapor. The passivation layer 134 is made of dielectric layer. The passivation layer 134 may include non-organic materials, such as silicon oxide, un-doped silicate glass, silicon oxynitride, solder resist (SR), silicon nitride, HMDS (hexamethyldisilazane). In some other embodiments, the passivation layer 134 is made of a polymer material, such as polyimide (PI), epoxy, or fluorine (F)-containing polymer.

Afterwards, a first photoresist layer 136 is formed over the passivation layer 134. The first photoresist layer 136 is formed by a patterning process. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Figure 1D:
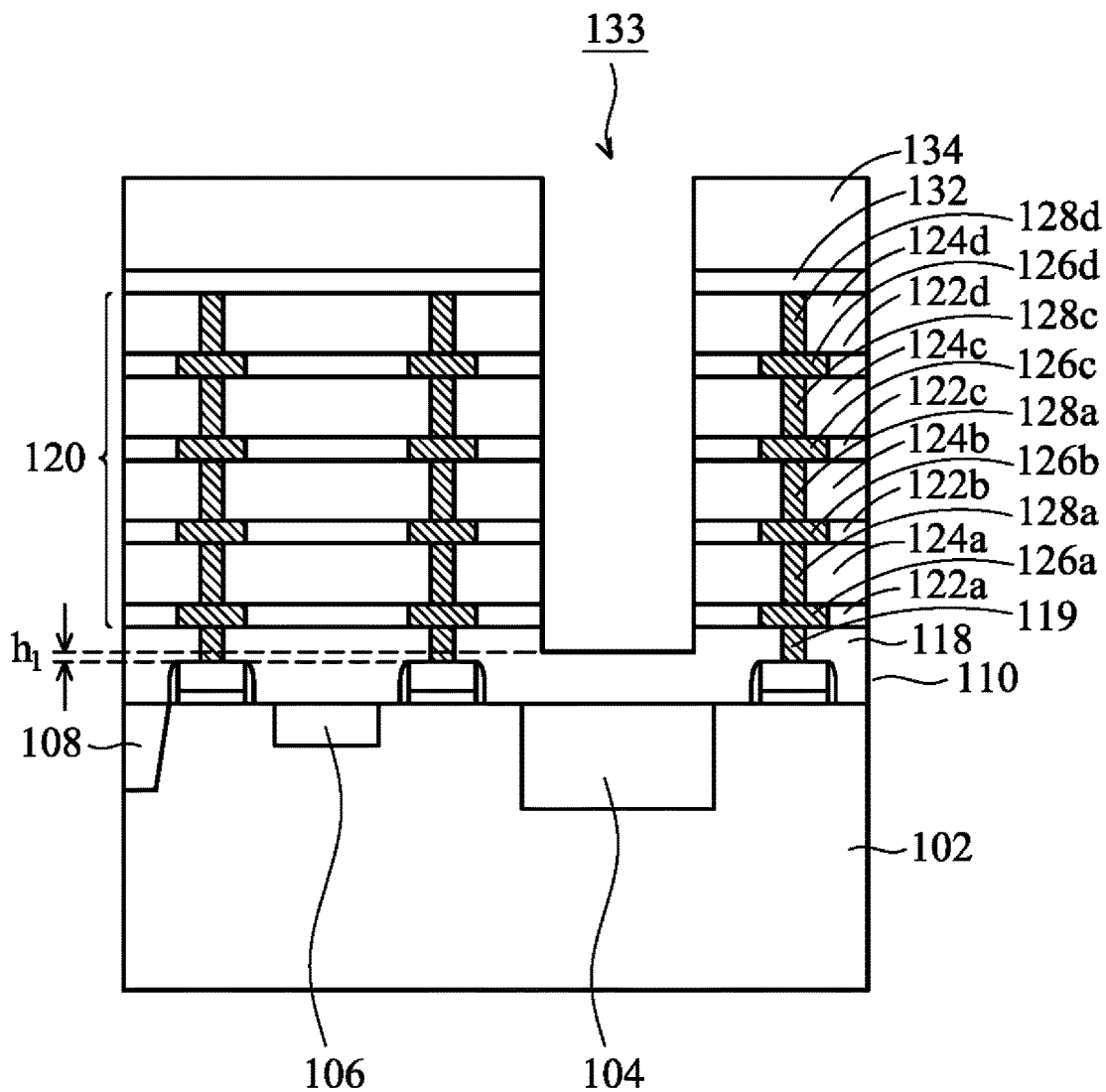

Next, as shown in FIG. 1D, a trench 133 is formed by performing a first etching process 11 to remove a portion of the passivation layer 134, in accordance with some embodiments of the disclosure. In addition, a portion of the fifth etching stop layer 132, the dielectric layers 124a, 124b, 124c and 124d, and the etching stop layers 122a, 122b, 122c and 122d are removed by using the first photoresist layer 136 as a mask. In some embodiments, the first etching process 11 is a dry etching process.

The trench 133 passes through the passivation layer 134, the fifth etching stop layer 132, the dielectric layers 124a, 124b, 124c and 124d, and the etching stop layer 122a, 122b, 122c and 122d. In addition, the trench 133 is directly above the pixel region 104.

The trench 133 has a bottom surface and a pair of sidewall surfaces, and the sidewall surfaces are perpendicular to the bottom surface. A bottom surface of the trench 133 is lower than a bottom surface of the first etching stop layer 122a, and it is higher than a top surface of the transistor structure 110. In some embodiments, the distance $h_1$ between the bottom surface of the trench 133 and the top surface of the transistor structure 110 is in a range from 0.1 A to 1700 A. If the distance $h_1$ is too short, the pixel region 104 may be damaged by the first etching process 11. If the distance $h_1$ is too long, the trench 133 is too far away from the pixel region 104, and the light collection efficiency may be too low.

Figure 1E:
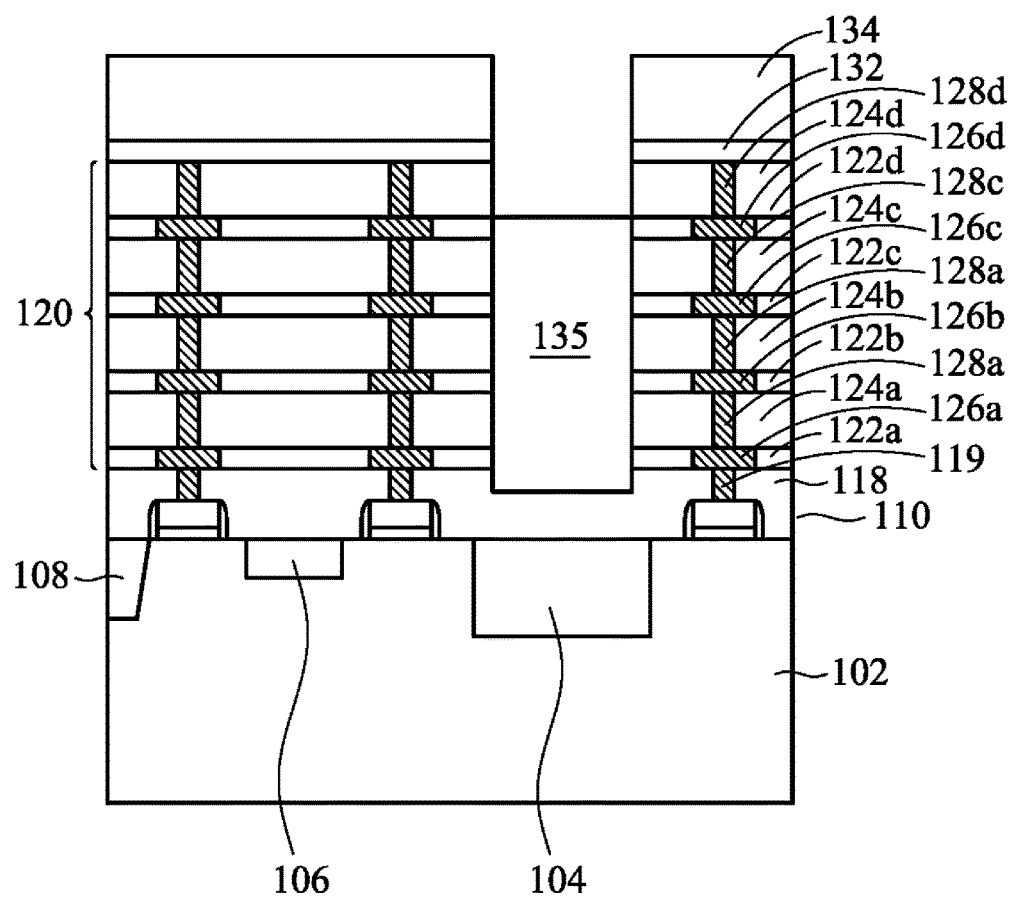

Afterwards, as shown in FIG. 1E, a protection layer 135 is formed in a bottom portion of the trench 133, in accordance with some embodiments of the disclosure. The protection layer 135 is configured to protect the bottom portion of the trench 133 from being etched or damaged by the subsequent etching process. The location of the protection layer is dependent on how many layers need to be protected. The shape of the bottom portion of the trench 133 may be preserved due to the protection of the protection layer 135. In some embodiments, the top surface of the protection layer 135 is level with a top surface of the fourth etching stop layer 122d. In some other embodiments, the top surface of the protection layer 135 is level with a top surface of the third etching stop layer 122c.

In some embodiments, the protection layer 135 is made of photoresist material. In some embodiments, the protection layer 135 is formed by a deposition process, such as a chemical vapor deposition (CVD) process or a physical vapor deposition (PVD) process.

Figure 1F:
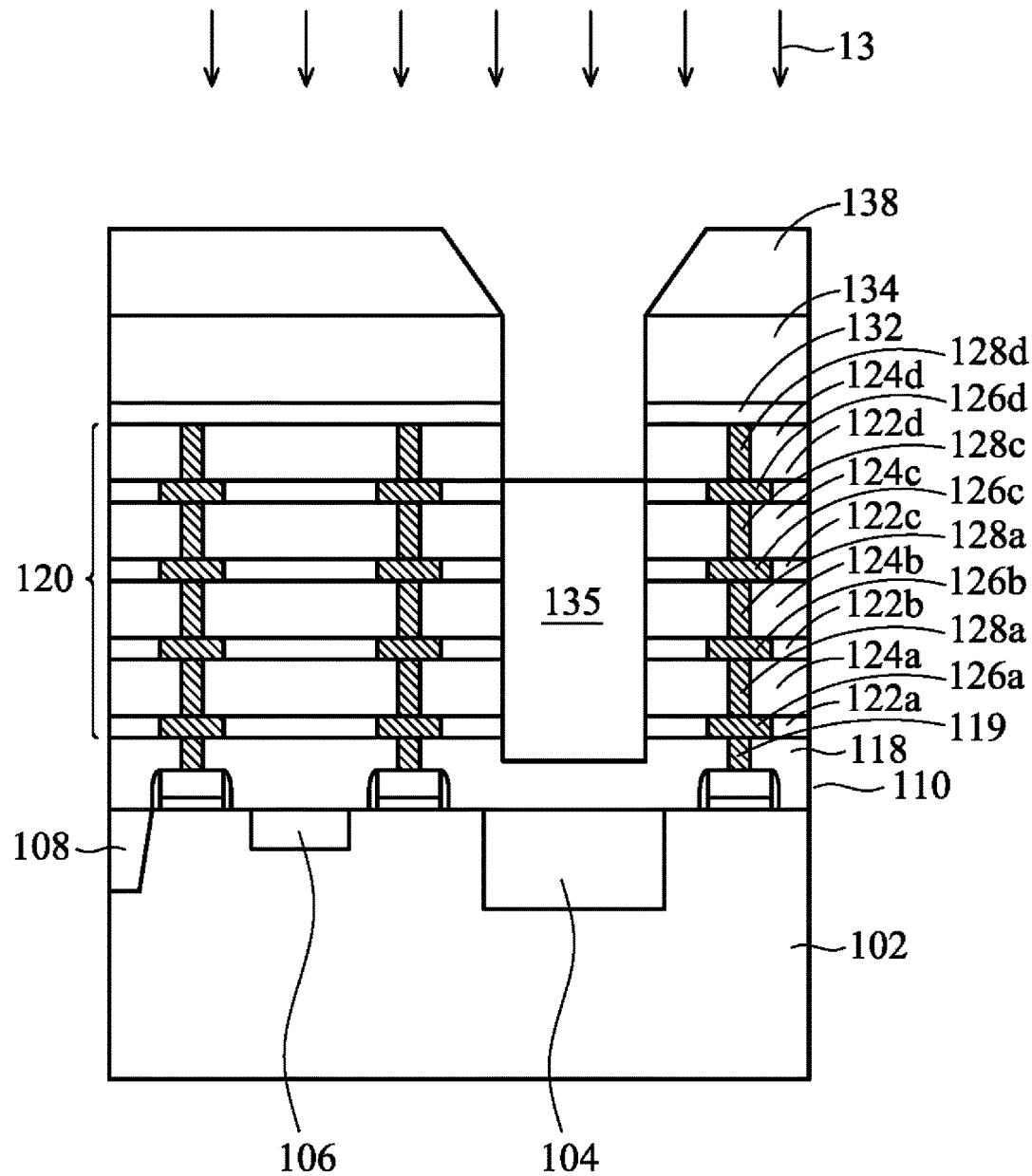

Next, as shown in FIG. 1F, a second photoresist layer 138 is formed over a top surface of the passivation layer 134, in accordance with some embodiments of the disclosure. The second photoresist layer 138 has a trapezoidal structure to define the underlying layers to have a sloped sidewall surface. The trapezoidal structure of the second photoresist layer 138 is used as a mask in a second etching process 13 to remove a portion of the underlying layers, such as the passivation layer 134 and the fifth etching stop layer 132. In some embodiments, the second etching process 13 is a dry etching process.

When the second photoresist layer 138 is a positive photoresist layer, the exposed region will be removed by a developer solution and unexposed region is left. The second photoresist layer 138 having a trapezoidal structure is formed by controlling the second photoresist layer 138 at different exposure levels during the exposure process. After performing a developing process, the second photoresist layer 138 has a trapezoidal structure, rather than a rectangular structure.

It should be noted that the trench 133 is adjacent to the conductive lines 126a, 126b, 126c and 126d, if the bottom portion 133b of the trench 133 is not completely covered or protected, the conductive lines 126a, 126b, 126c and 126d may be etched to degrade the performance of the interconnect structure 120. Therefore, the protection layer 135 is designed to have an etching resistance which is higher than that of the passivation layer 134 and that of the fifth etching stop layer 132. In addition, the protection layer 135 is designed to have an etching resistance which is higher than that of the second photoresist layer 138 to ensure the protection layer 135 is not removed during the second etching process 13. In some embodiments, the protection layer 135 and the second photoresist layer 138 are made of different materials.

Figure 1G:
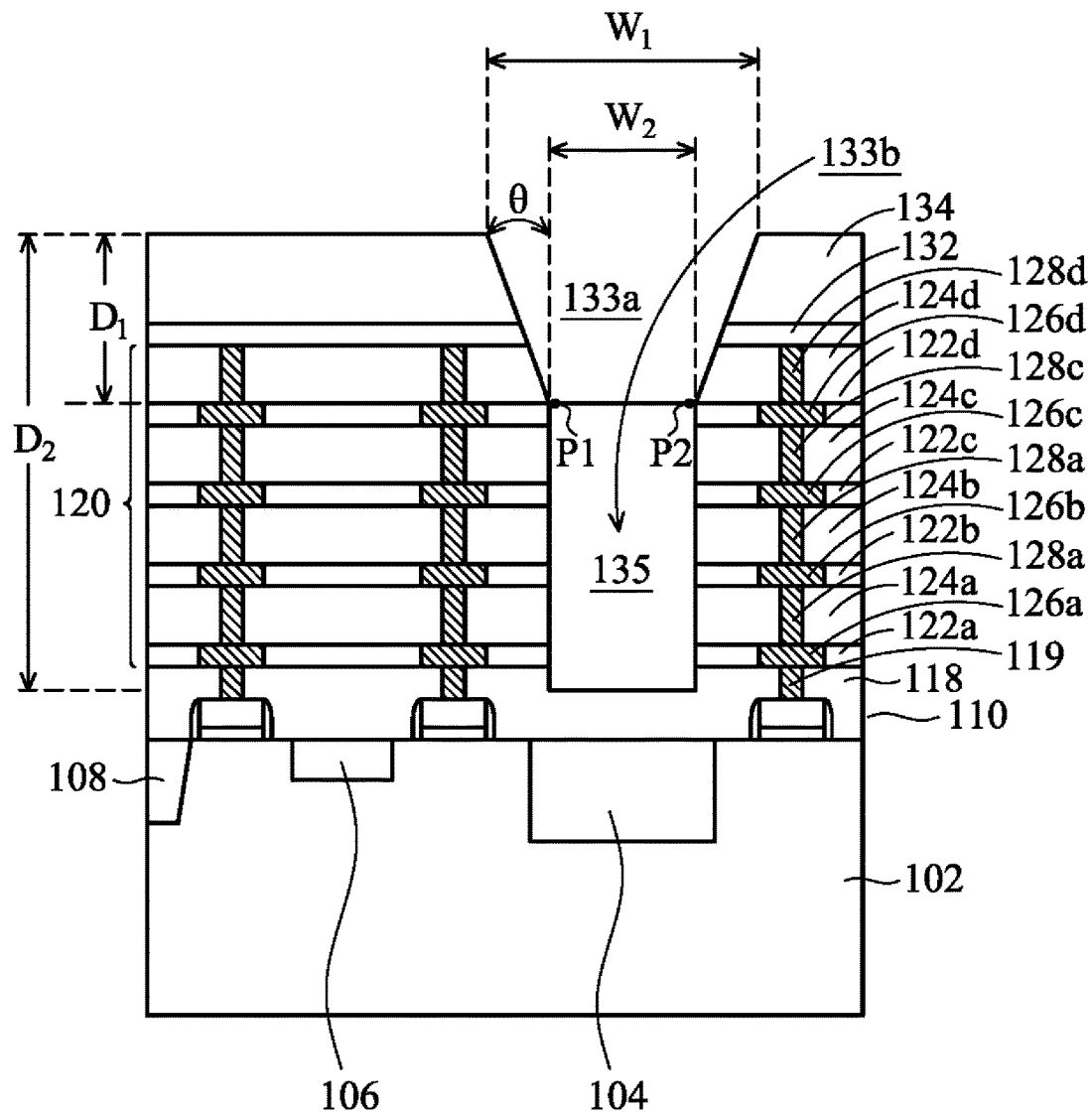

Afterwards, as shown in FIG. 1G, a portion of the passivation layer 134, and a portion of the fifth etching stop layer 132 are removed in the second etching process 13, in accordance with some embodiments of the disclosure. As a result, the trench 133 has a wide top portion 133a and a narrow bottom portion 133b (filled with the protection layer 135). In other words, the top portion 133a of the trench 133 is enlarged, and the shape of the bottom portion 133b is maintained due to the protection of the protection layer 135.

The wide top portion 133a of the trench 133 has a pair of top sidewall surfaces in a cross section view, and the narrow bottom portion 133b of the trench 133 has a pair of bottom sidewall surfaces in a cross section view. The top sidewall surfaces taper gradually toward the bottom sidewall surfaces. The top sidewall surfaces include a left top sidewall surface and a right top sidewall surface, and the bottom sidewall surfaces include a right bottom sidewall surface and a left bottom sidewall surface. A first intersection $P_1$ is between the left top sidewall surface and the left bottom sidewall surface, and a second intersection $P_2$ is between the right top sidewall surface and right bottom sidewall surface. The first intersection $P_1$ and the second intersection $P_2$ are level with the top surface of the fourth etching stop layer 122d. In some other embodiments, the first intersection $P_1$ is level with the top surface of the third etching stop layer 122c.

There is an angle $\theta$ is between the left top sidewall surface and a normal line which is perpendicular to the front side of the substrate 102. The angle $\theta$ is an acute angle measured in a counter-clockwise direction from the normal line. In some embodiments, the angle $\theta$ is in a range from about 5 degrees to 10 degrees.

As shown in FIG. 1G, the wide top portion 133a has a top width $W_1$, and the narrow bottom portion 133b has a uniform bottom width $W_2$. The top width $W_1$ of the wide top portion 133a is greater than the bottom width $W_2$ of the narrow bottom portion 133b. In some embodiments, a ratio of the bottom width $W_2$ to the top width $W_1$ is in a range from 0.9 to 0.75. In some embodiments, the bottom width $W_2$ is in a range from 1.5 μm to 2.5 μm.

As shown in FIG. 1G, the wide top portion 133a has a first depth $D_1$, and the narrow bottom portion 133b has a second depth $D_2$ measured from a top surface of the passivation layer 134. In some embodiments, the depth ratio of the first depth $D_1$ to the second depth $D_2$ is in a range from 0.15 to about 0.33. When the depth ratio of the trench 133 is in the above-mentioned range, the performance of the image sensor 104 is improved.

Figure 1H:
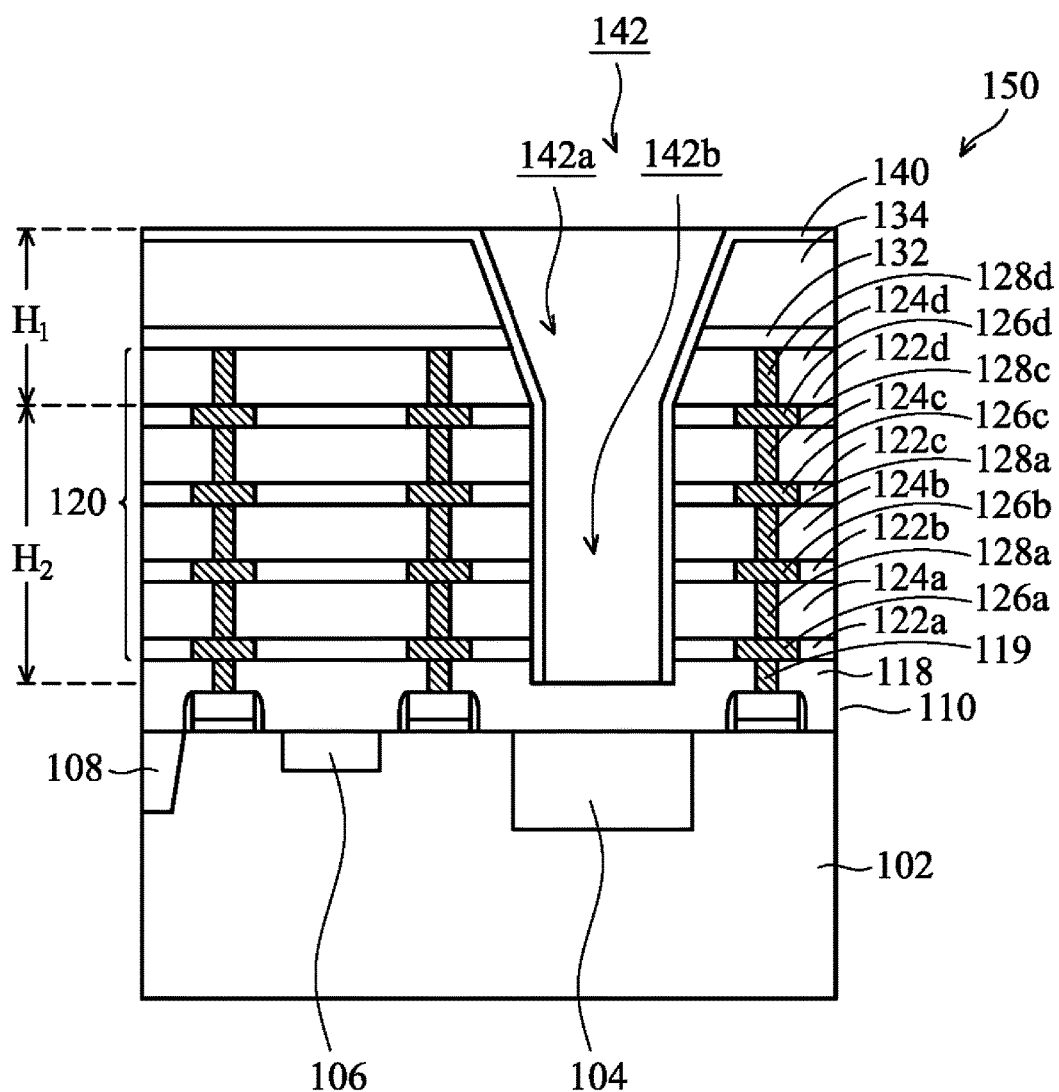

After the protection layer 135 is removed, as shown in FIG. 1H, a liner layer 140 is formed on the sidewall surfaces and a bottom surface of the trench 133, in accordance with some embodiments of the disclosure. Next, a transparent dielectric layer 142 is formed on the liner layer 140, and a planarizing process is performed to remove the excess of the transparent dielectric layer 142 outside of the trench 133. Therefore, a light pipe 150 is formed by the liner layer 140 and the transparent dielectric layer 142, and light pipe 150 has a planar top surface.

The liner layer 140 is used as a protection layer to isolate the transparent dielectric layer 142 and the adjacent layers, such as dielectric layers 124a, 124b, 124c and 124d of the interconnect structure 120. In some embodiments, the liner layer 140 is made of dielectric materials, such as silicon oxide or silicon nitride. In some embodiments, the liner layer is formed by a deposition process, such as a chemical vapor deposition process (CVD), a physical vapor deposition process (PVD), a spin-on coating process or another applicable process.

The transparent dielectric layer 142 is used to provide a path for transmitting the light from top to bottom. The transparent dielectric layer 142 has a refractive index that is higher than the refractive index of the dielectric layers 124a, 124b, 124c and 124d of the interconnect structure 120. In some embodiments, the transparent dielectric layer 142 is made of silicon nitride, BPSG (boro-phospho-silicate glass), or another applicable material. In some other embodiments, the transparent dielectric layer 142 is made of polymer material, such as polymethyl methacrylate (PMMA), polycarbonate (PC), epoxy, cellulose acetate, cellulose propionate, other suitable polymer materials, or combinations thereof. The transparent dielectric layer 142 is formed by a spin-on process, a chemical vapor deposition (CVD) process or another applicable process.

As shown in FIG. 1H, the transparent dielectric layer 142 has a wide top portion 142a and a narrow bottom portion 142b. The wide top portion 142a of the transparent dielectric layer 142 has a pair of top sidewall surfaces that taper gradually toward the bottom sidewall surfaces of the bottom portion 142b. In some embodiments, the height ratio of the first height $H_1$ of the wide top portion 142a to a second height $H_2$ of the narrow bottom portion 142b is in a range from 0.20 to about 0.53. If the height ratio is within the above-mentioned range, the amount of incident light source to image sensor 104 is increased. (The first height $H_1$ and the second height $H_2$ are correlated with the first depth $D_1$ and the second depth $D_2$ as shown in FIG. 1G.)

Figure 1I:
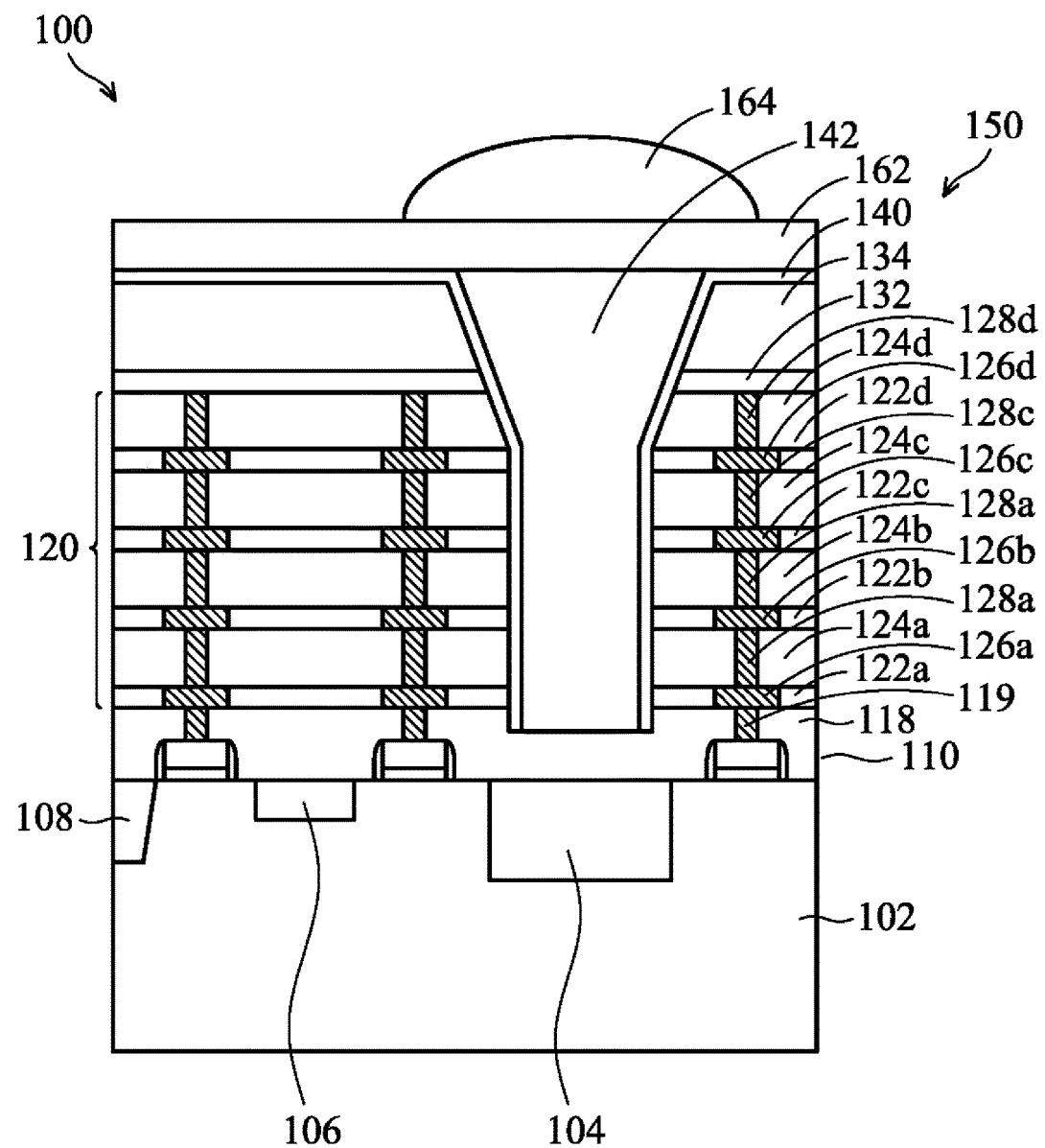

Next, as shown in FIG. 1I, a color filter layer 162 is formed over the light pipe 150 and a microlens structure 164 is formed over the color filter layer 162, in accordance with some embodiments of the disclosure. The color filter layer 162 aligned with the pixel region 104 is configured to filter visible light and allow light in the specific wavelength to pass through the light pipe 150 to the pixel region 104.

The color filter layer 162 may be made of dye-based (or pigment-based) polymer for filtering out a specific frequency band (for example, a desired wavelength of light). In some other embodiments, the color filter layer 162 is made of resins or other organic-based materials having color pigments.

In some embodiments, the microlens structure 164 has a curved upper surface. The microlens structure 164 may have a variety of shapes and sizes depending on the index of refraction of the material used in the microlens structure 164.

The dimensions of the light pipe 150 are limited due to the routing of the conductive layers 126a, 126b, 126c and 126d or the conductive vias 128a, 128b, 128c and 128d of the interconnect structure 120. The amount of the light collected by the light pipe 150 is dependent on the dimensions of the light pipe 150. In order to improve or increase the amount of light collection, the light pipe 150 is constructed by a wide top portion and a narrow bottom portion. A greater amount of incident light is passed through the wide top portion of the light pipe 150 and reaches the pixel region 104. Therefore, the sensitivity and performance of the FSI device structure 100 is improved.

Figure 2:
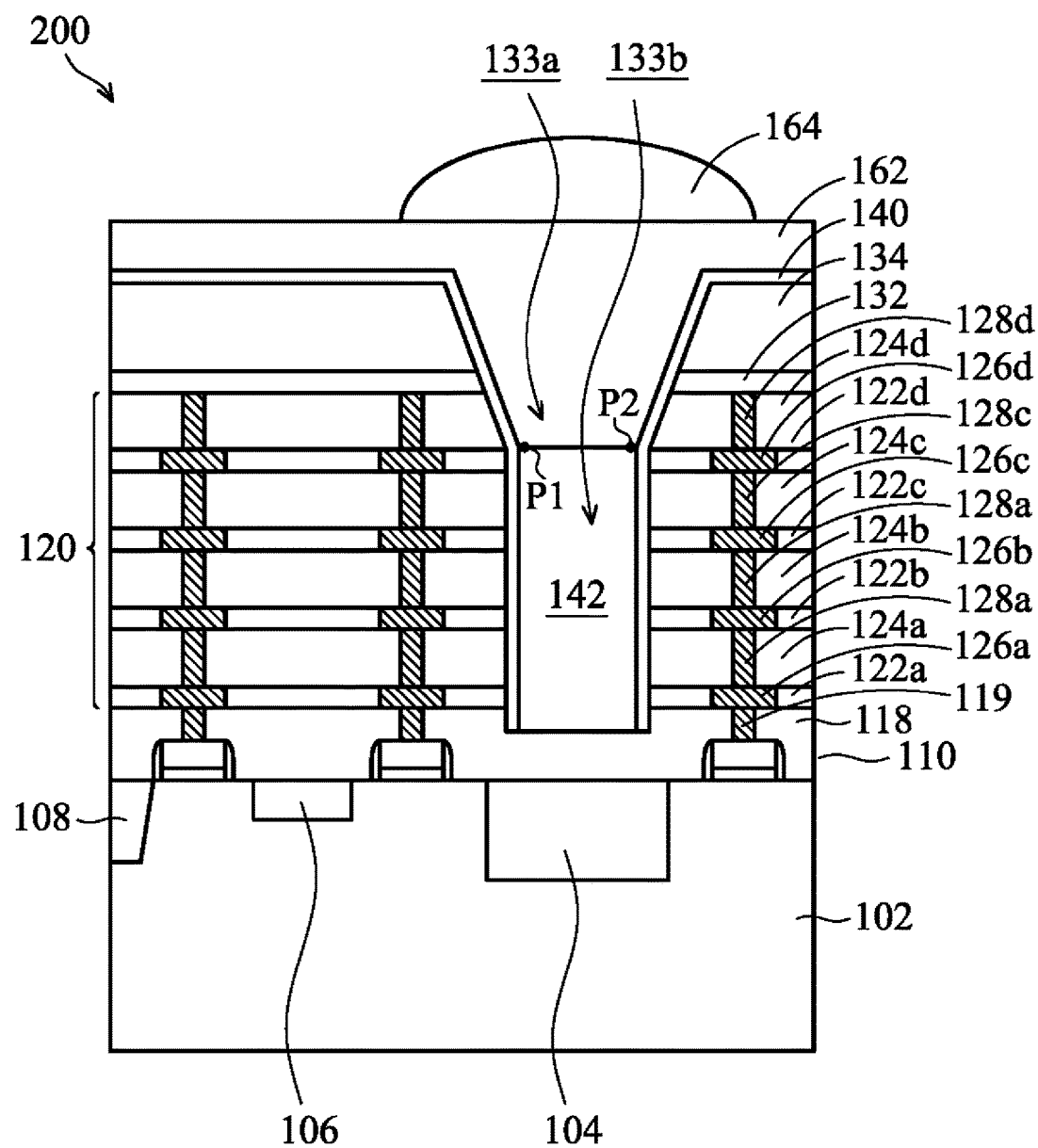
FIG. 2 shows a cross-sectional representation of a front-side illuminated (FSI) image sensor device structure, in accordance with some embodiments of the disclosure.

FIG. 2 shows a cross-sectional representation of a front-side illuminated (FSI) image sensor device structure 200, in accordance with some embodiments of the disclosure. Some processes and materials used to form the FSI image sensor structure 200 are similar to, or the same as, those used to form the semiconductor structure 100 and are not repeated herein.

The difference between FIG. 2 and FIG. 1I is that the transparent dielectric layer 142 is only filled with the narrow bottom portion 133b in FIG. 2. The wide top portion 133a is filled with the color filter layer 162.

Figure 3:
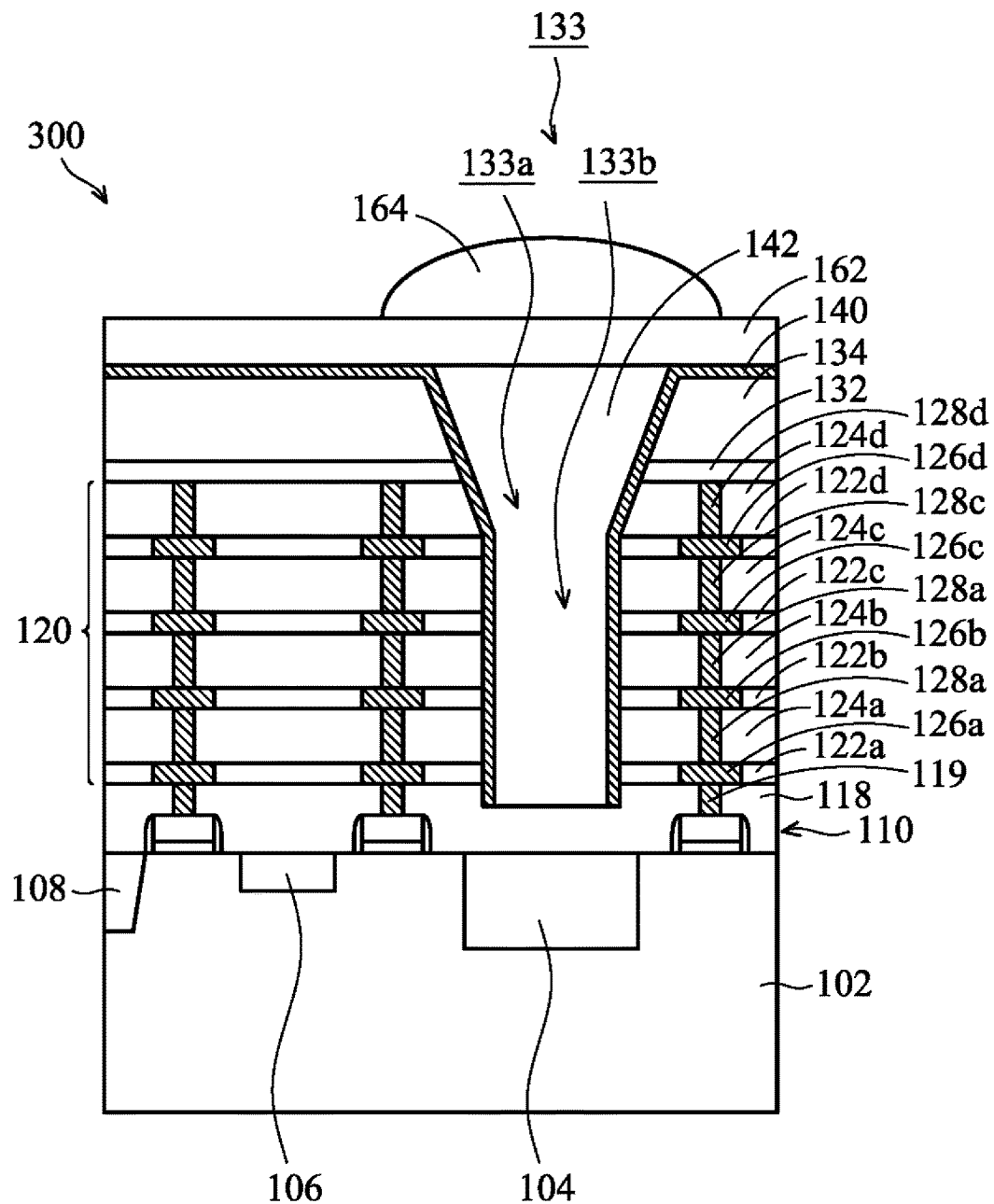
FIG. 3 shows a cross-sectional representation of a front-side illuminated (FSI) image sensor device structure, in accordance with some embodiments of the disclosure.

FIG. 3 shows a cross-sectional representation of a front-side illuminated (FSI) image sensor device structure 300, in accordance with some embodiments of the disclosure. Some processes and materials used to form the FSI image sensor structure 300 are similar to, or the same as, those used to form semiconductor structure 100 and are not repeated herein.

The difference between FIG. 3 and FIG. 1I is that the liner layer 140 in FIG. 1I is replaced by a light reflective material 141, such as aluminum (Al). Because light reflective material 141 is on sidewall surfaces of the top portion 133a and sidewall surfaces of the bottom portion 133b of the trench 133, the refractive index of the transparent dielectric layer 142 in FIG. 3 may be lower than that in FIG. 1I. Note that the light reflective material 141 is only formed on sidewall surfaces of the trench 133, not formed on the bottom surface of the trench 133 to allow the light to pass through the transparent dielectric layer 142 and reach the pixel region 104.

FIGS. 4A-4D show cross-sectional representations of various stages of forming a front-side illuminated image sensor device structure 400, in accordance with some embodiments of the disclosure.

Figure 4A:
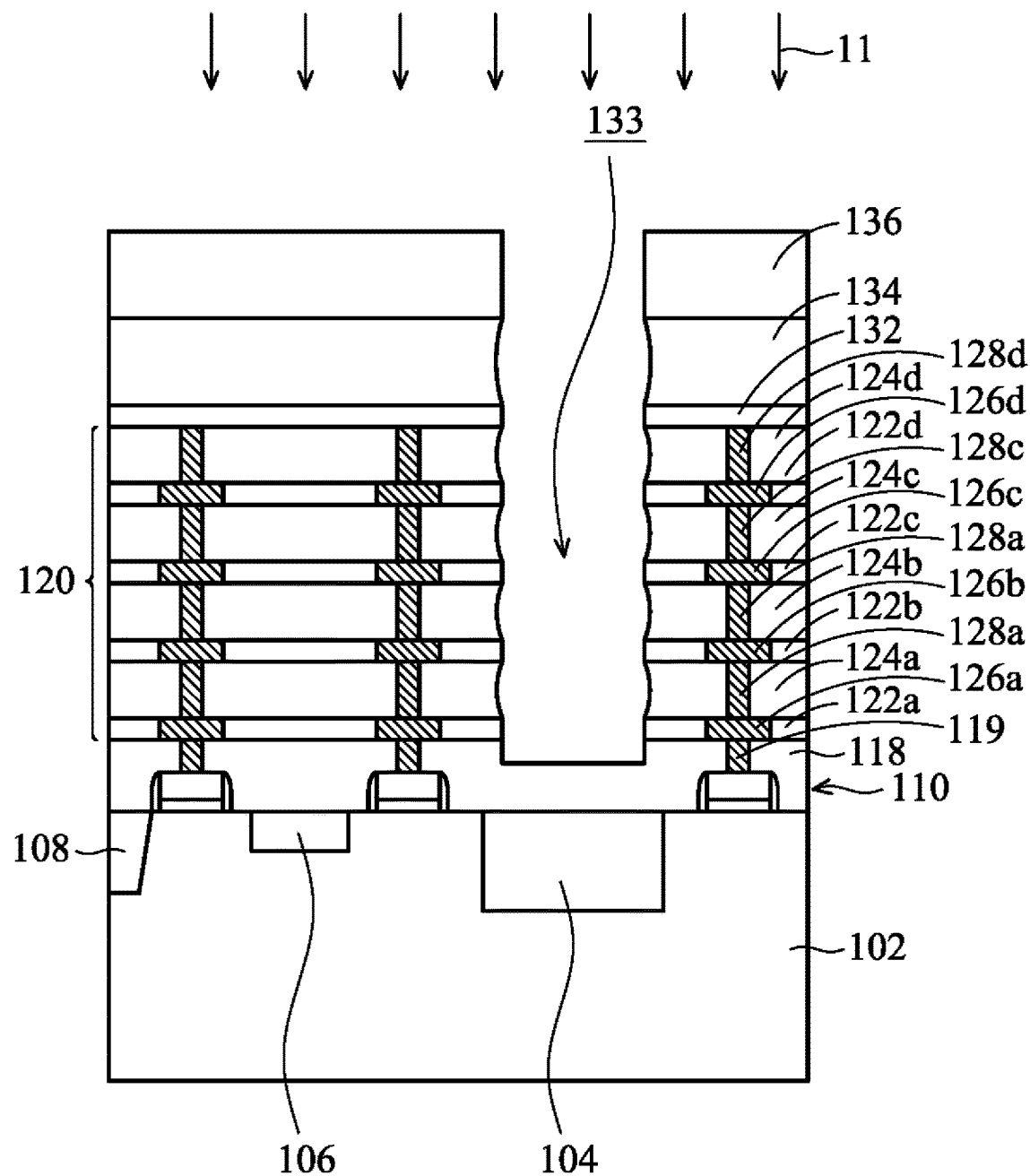
FIGS. 4A-4D show cross-sectional representations of various stages of forming a front-side illuminated image sensor device structure, in accordance with some embodiments of the disclosure.

As shown in FIG. 4A, the first etching process 11 is performed by using the first photoresist layer 136 as a mask. As a result, the trench 133 is formed by removing a portion of the passivation layer 134 and underlying layers. Since the etching stop layers 122a, 122b, 122c and 122d, and the fifth etching stop layer 132 have an etching resistance which is higher than that of the dielectric layers 124a, 124b, 124c and 124d, and the passivation layer 134, the sidewall surface of the trench 133 has a wave-shaped structure in a cross section view after the first etching process 11. In other words, the dielectric layers 124a, 124b, 124c and 124d, and the passivation layer 134 are etched more than the etching stop layers 122a, 122b, 122c and 122d, and the fifth etching stop layer 132. The sidewall surface of the trench 133 has a recess with a recessed depth $R_1$. In some embodiments, the recessed depth $R_1$ is in a range from about 8 nm to about 12 nm.

Figure 4B:
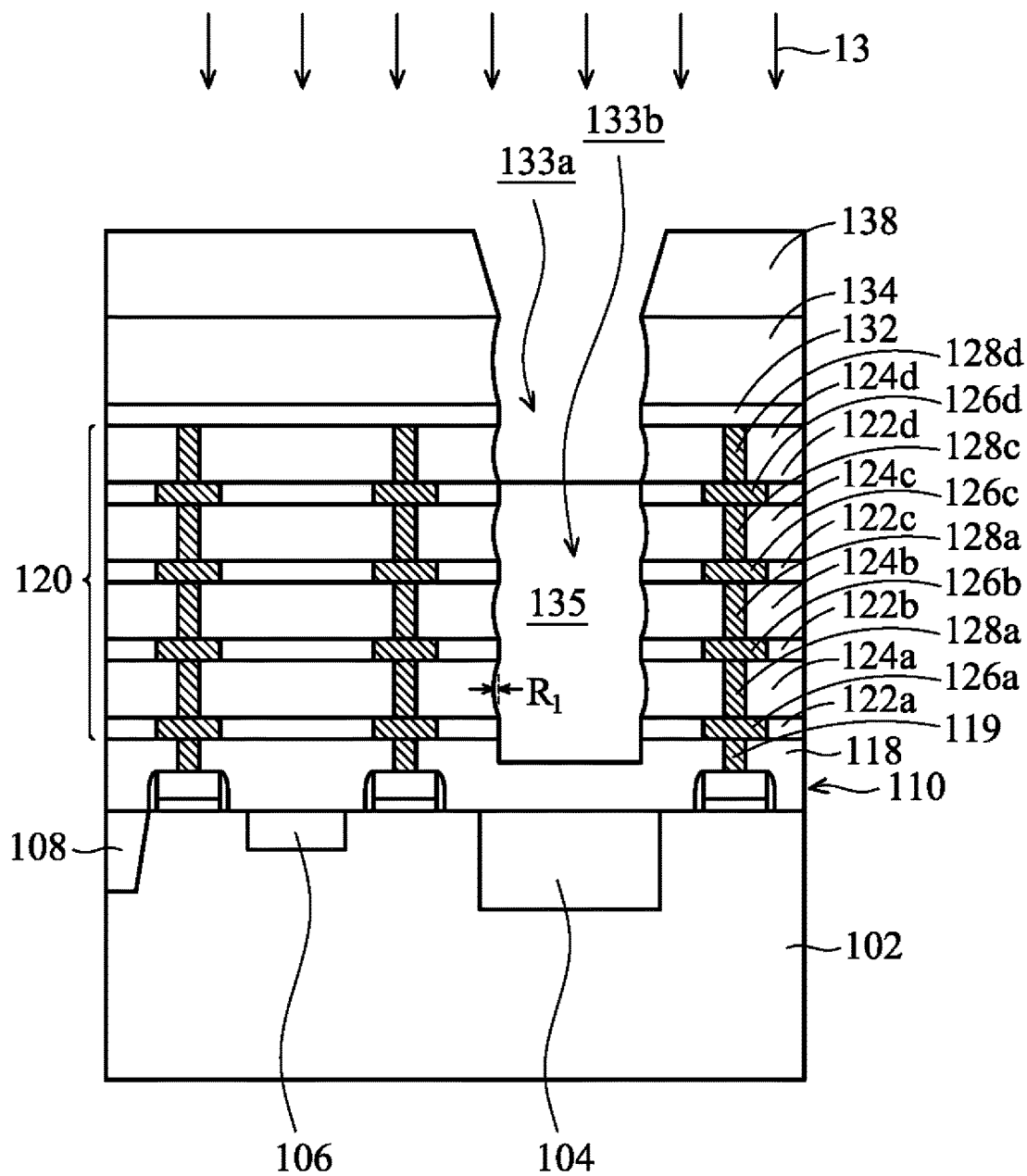

Afterwards, as shown in FIG. 4B, the protection layer 135 is filled with the bottom portion 133b of the trench 133, and the second photoresist layer 138 is formed over a top surface of the passivation layer 134, in accordance with some embodiments of the disclosure. Next, a portion of the passivation layer 134 and the fifth etching stop layer 132 are removed to enlarge the top width of the top portion 133a of the trench 133.

The second photoresist layer 138 has a trapezoidal structure to define the underlying layers to have a sloped sidewall surface. The trapezoidal structure of the second photoresist layer 138 is used as a mask in a second etching process 13 to remove a portion of the underlying layers, such as the passivation layer 134 and the fifth etching stop layer 132.

Figure 4C:
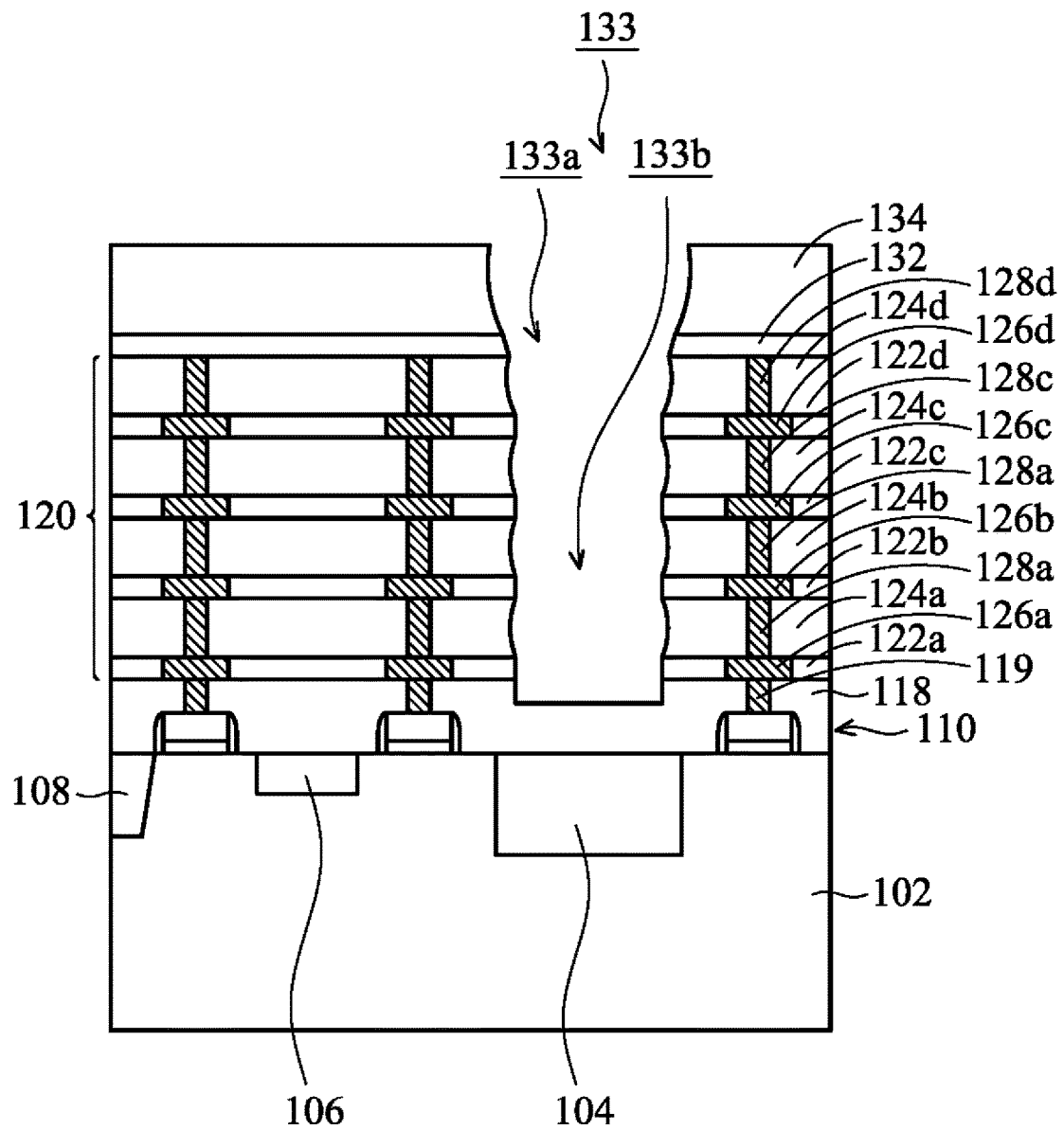

Afterwards, as shown in FIG. 4C, the second photoresist layer 138 and the protection layer 135 are sequentially removed. As a result, the trench 133 has a wide top portion 133a and a narrow bottom portion 133b.

The top portion 133a of the trench 133 has a pair of top sidewall surfaces in a cross section view, and the narrow bottom portion 133b of the trench 133 has a pair of bottom sidewall surfaces in a cross section view. The top sidewall surfaces taper gradually toward the bottom sidewall surfaces. The top sidewall surfaces and the bottom sidewall surfaces both have a wave-shaped structure in a cross section view.

Figure 4D:
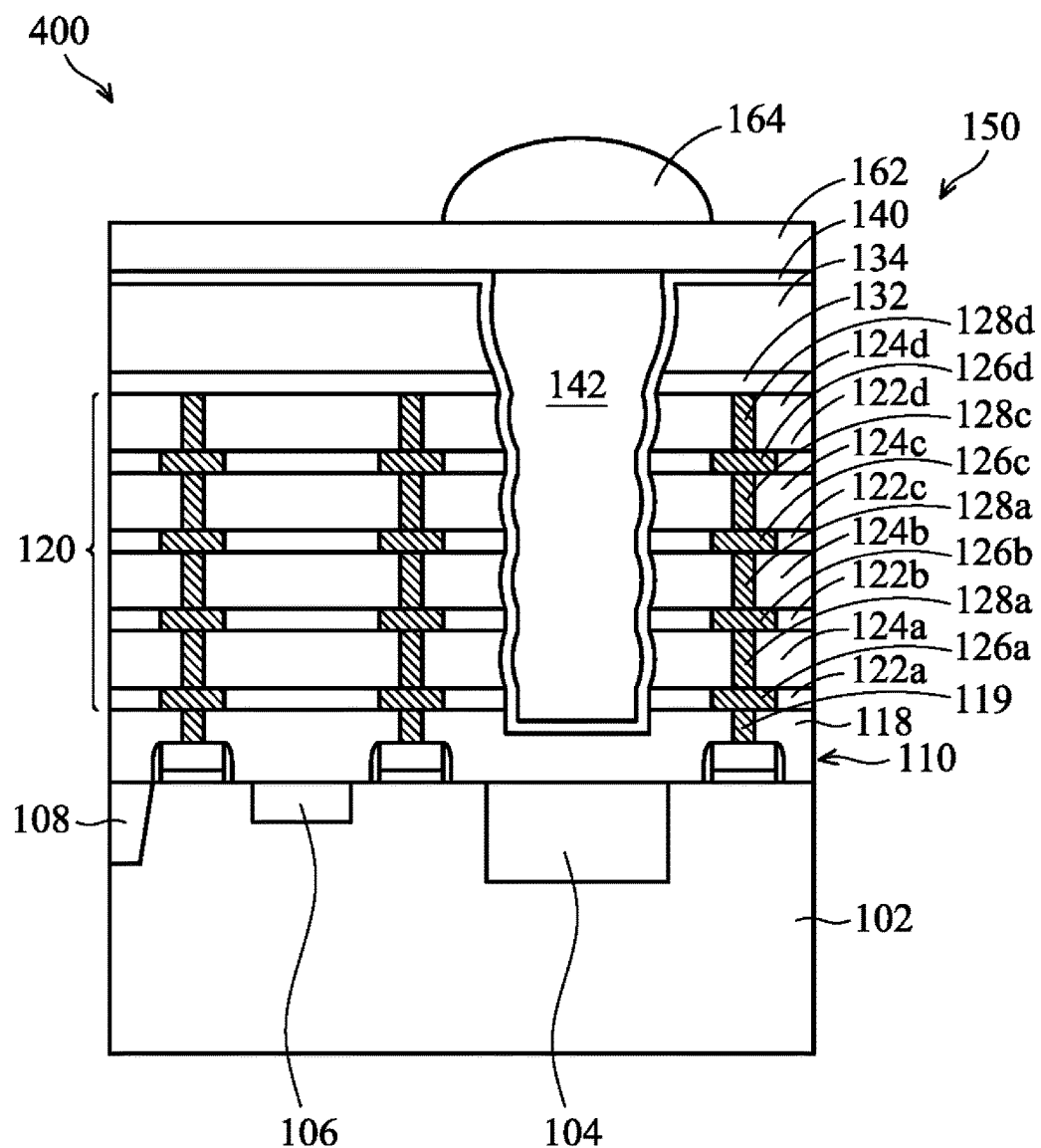

Afterwards, as shown in FIG. 4D, the trench 133 is filled with the liner layer 140 and the transparent dielectric layer 142 to form the light pipe 150. Next, the color filter layer 162 is formed over the light pipe 150 and the microlens structure 164 is formed over the color filter layer 162.

Embodiments for forming an FSI image sensor device structure and method for formation of the same are provided. The FSI image sensor device structure has a light pipe passing through the interconnect structure. The light pipe has a wide top portion and a narrow bottom portion and is formed by filling transparent materials into the trench. The narrow bottom portion is formed and then protected and the top portion of the trench is enlarged by using a photoresist layer with a trapezoidal structure as a mask. As a result, the wide top portion of the light pipe improves the amount of light collection. Therefore, the sensitivity and the performance of the FSI image sensor device structure are improved.

In some embodiments, a method for forming an FSI image sensor device structure is provided. The method includes forming a pixel region in a substrate and forming a dielectric layer over the substrate. The method includes forming a trench through the dielectric layer, and the trench includes a top portion and a bottom portion, and the trench is directly above the pixel region. The method also includes forming a protection layer in the bottom portion of the trench and enlarging a top width of the top portion of the trench, such that the trench has a wide top portion and a narrow bottom portion. The wide top portion has a pair of top sidewall surfaces, the narrow bottom portion has a pair of bottom sidewall surfaces, and the top sidewall surfaces taper gradually toward the bottom sidewall surfaces. The method further includes filling a transparent dielectric layer in the trench to form a light pipe.

In some embodiments, a method for forming an FSI image sensor device structure is provided. The method includes forming a pixel region in a substrate and forming an interconnect structure over the substrate. The method includes forming a passivation layer over the interconnect structure and forming a trench through the passivation layer and the interconnect structure. The trench is directly above the pixel region. The method also includes forming a protection layer in a bottom portion of the trench, and a sidewall of the interconnect structure is covered by the protection layer. The method further includes etching a portion of the passivation layer, such that the trench has a wide top portion and a narrow bottom portion. The method includes filling a transparent dielectric layer in the trench to form a light pipe.

In some embodiments, a method for forming an FSI image sensor device structure is provided. The method includes forming a pixel region in a substrate and forming a first etching stop layer over the substrate. The method includes forming an interconnect structure over the etching stop layer and forming a second etching stop layer over the interconnect structure. The method also includes forming a passivation layer over the second etching stop layer and forming a trench through the passivation layer, the interconnect structure and the first etching stop layer. The trench is directly above the pixel region. The method further includes forming a protection layer in a bottom portion of the trench and etching a portion of the passivation layer, such that the trench has a top sidewall surface and a bottom sidewall surface. There is an intersection between the top sidewall surface and the bottom sidewall surface, and the intersection is adjoining a top surface of the second etching stop layer. The method includes filling a transparent dielectric layer in the trench to form a light pipe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a front-side illuminated image sensor device structure, comprising:
   forming a pixel region in a substrate;
   forming a dielectric layer over the substrate;
   forming a trench through the dielectric layer, wherein the trench comprises a top portion and a bottom portion, and the trench is directly above the pixel region;
   forming a protection layer in the bottom portion of the trench;
   enlarging a top width of the top portion of the trench, such that the trench has a wide top portion and a narrow bottom portion, wherein the wide top portion has a pair of top sidewall surfaces, the narrow bottom portion has a pair of bottom sidewall surfaces, and the top sidewall surfaces taper gradually toward the bottom sidewall surfaces;
   removing the protection layer to expose a sidewall surface of the trench; and
   filling a transparent dielectric layer in the trench to form a light pipe.

2. The method for forming the front-side illuminated image sensor device structure as claimed in claim 1, further comprising:
   forming a transistor structure in the dielectric layer, wherein a bottom surface of the trench is higher than a top surface of the transistor structure.

3. The method for forming the front-side illuminated image sensor device structure as claimed in claim 1, further comprising:
   forming an etching stop layer in the dielectric layer, wherein a bottom surface of the trench is lower than a bottom surface of the etching stop layer.

4. The method for forming the front-side illuminated image sensor device structure as claimed in claim 1, further comprising:
   forming a color filter layer over the transparent dielectric layer; and
   forming a microlens structure over the color filter layer.

5. The method for forming the front-side illuminated image sensor device structure as claimed in claim 1, further comprising:

forming a liner layer on the top sidewall surfaces and the bottom sidewall surfaces of the trench; and forming the transparent dielectric layer on the liner layer.

6. The method for forming the front-side illuminated image sensor device structure as claimed in claim 5, wherein the liner layer is made of reflective material.

7. The method for forming the front-side illuminated image sensor device structure as claimed in claim 1, wherein the top sidewall surfaces have a wave-shaped structure in a cross section view, and the bottom sidewall surfaces have a wave-shaped structure in a cross section view.

8. The method for forming the front-side illuminated image sensor device structure as claimed in claim 1, further comprising:

forming the transparent dielectric layer in the narrow bottom portion of the trench; and forming a color filter layer in the wide top portion of the trench.

9. A method for forming a front-side illuminated image sensor device structure, comprising:

forming a pixel region in a substrate;

forming an interconnect structure over the substrate;

forming a passivation layer over the interconnect structure;

forming a trench through the passivation layer and the interconnect structure, wherein the trench is directly above the pixel region;

forming a protection layer in a bottom portion of the trench, wherein a sidewall of the interconnect structure is covered by the protection layer;

etching a portion of the passivation layer, such that the trench has a wide top portion and a narrow bottom portion, wherein the wide top portion of the trench has a top sidewall surface, the narrow bottom portion of the trench has a bottom sidewall surface, an intersection is between the top sidewall surface and the bottom sidewall surface, and the intersection is lower than a top surface of the interconnect structure; and filling a transparent dielectric layer in the trench to form a light pipe.

10. The method for forming the front-side illuminated image sensor device structure as claimed in claim 9, further comprising:

forming an etching stop layer over the substrate, wherein the etching stop layer is between the substrate and the interconnect structure, and a bottom surface of the trench is lower than a bottom surface of the etching stop layer.

11. The method for forming the front-side illuminated image sensor device structure as claimed in claim 9, wherein etching the portion of the passivation layer comprises:

forming a photoresist layer over a top surface of the passivation layer, wherein the photoresist layer has a trapezoidal structure; and etching the portion of the passivation layer by using the photoresist layer as a mask.

12. The method for forming the front-side illuminated image sensor device structure as claimed in claim 9, wherein the interconnect structure comprises a plurality of conductive lines in a plurality of dielectric layers, and an etching stop layer is between two adjacent dielectric layers, and a sidewall surface of the trench has a wave-shaped structure in a cross section view.

13. The method for forming the front side illuminated image-sensor device structure as claimed in claim 9, further comprising:

forming a color filter layer over the transparent dielectric layer; and forming a microlens structure over the color filter layer.

14. The method for forming the front side illuminated image-sensor device structure as claimed in claim 9, wherein the wide top portion has a pair of top sidewall surfaces, the narrow bottom portion has a pair of bottom sidewall surfaces, and the top sidewall surfaces taper gradually toward the bottom sidewall surfaces.

15. The method for forming the front side illuminated image-sensor device structure as claimed in claim 9, further comprising:

forming a liner layer on sidewalls of the trench, wherein the liner layer is made of light reflective material, and the light reflective material is not formed on a bottom surface of the trench; and filling the transparent dielectric layer on the liner layer.

16. The method for forming the front-side illuminated image sensor device structure as claimed in claim 9, further comprising:

removing the protection layer to expose a sidewall surface of the trench.

17. A method for forming a front-side illuminated image sensor device structure, comprising:

forming a pixel region in a substrate;

forming a first etching stop layer over the substrate;

forming an interconnect structure over the first etching stop layer;

forming a second etching stop layer over the interconnect structure;

forming a passivation layer over the second etching stop layer;

forming a trench through the passivation layer, the interconnect structure and the first etching stop layer, wherein the trench is directly above the pixel region;

forming a protection layer in a bottom portion of the trench;

etching a portion of the passivation layer, such that the trench has a top sidewall surface and a bottom sidewall surface, wherein there is an intersection between the top sidewall surface and the bottom sidewall surface, and the intersection is adjoining a top surface of the second etching stop layer; and filling a transparent dielectric layer in the trench to form a light pipe.

18. The method for forming the front-side illuminated image sensor device structure as claimed in claim 17, wherein the top sidewall surface of the trench has a wave-shaped structure in a cross section view.

19. The method for forming the front-side illuminated image sensor device structure as claimed in claim 17, wherein etching the portion of the passivation layer comprises:

forming a photoresist layer over a top surface of the passivation layer, wherein the photoresist layer has a trapezoidal structure; and etching the portion of the passivation layer by using the photoresist layer as a mask.

20. The method for forming the front-side illuminated image sensor device structure as claimed in claim 17, further comprising:

forming a color filter layer over the transparent dielectric layer; and forming a microlens structure over the color filter layer.

* * * * *